US011963310B2

(12) United States Patent
Tuominen et al.

(10) Patent No.: US 11,963,310 B2
(45) Date of Patent: Apr. 16, 2024

(54) COMPONENT CARRIER HAVING COMPONENT COVERED WITH ULTRA-THIN TRANSITION LAYER

(71) Applicant: AT&S (China) Co. Ltd., Shanghai (CN)

(72) Inventors: Mikael Tuominen, Pernio (FI); Seok Kim Tay, Singapore (SG); Kim Liu, Kunshan (CN); Artan Baftiri, Chongqing (CN); Henry Guo, Suqian (CN)

(73) Assignee: AT&S(China) Co. Ltd., Shanghai (CN)

( * ) Notice: Subject to any disclaimer, the term of this patent is extended or adjusted under 35 U.S.C. 154(b) by 0 days.

(21) Appl. No.: 17/139,871

(22) Filed: Dec. 31, 2020

(65) Prior Publication Data

US 2021/0227702 A1     Jul. 22, 2021

(30) Foreign Application Priority Data

Jan. 22, 2020   (CN) .......................... 202010073861.8

(51) Int. Cl.
*H05K 3/46*      (2006.01)
*H05K 1/02*      (2006.01)
*H05K 1/18*      (2006.01)

(52) U.S. Cl.
CPC .......... *H05K 3/467* (2013.01); *H05K 1/0271* (2013.01); *H05K 1/181* (2013.01); *H05K 1/183* (2013.01); *H05K 1/185* (2013.01); *H05K 3/4697* (2013.01)

(58) Field of Classification Search
CPC ........ H05K 3/46; H05K 3/4697; H05K 1/185; H05K 1/183; H05K 1/181; H05K 1/0271; H05K 3/467

USPC ......................................................... 174/256
See application file for complete search history.

(56) References Cited

U.S. PATENT DOCUMENTS

| | | | |
|---|---|---|---|
| 6,039,436 A * | 3/2000 | Andrews | B41J 2/14129 347/62 |
| 8,354,338 B2 | 1/2013 | Hu et al. | |
| 2006/0263936 A1 | 11/2006 | Hsu | |
| 2007/0085205 A1 | 4/2007 | Chen et al. | |
| 2009/0085192 A1 | 4/2009 | Hsu et al. | |

(Continued)

FOREIGN PATENT DOCUMENTS

| | | |
|---|---|---|
| CN | 108366494 A | 8/2018 |
| CN | 109757025 A | 5/2019 |

(Continued)

OTHER PUBLICATIONS

Kästner, M; Extended European Search Report in Application No. 20217845.5; pp. 1-10; dated May 31, 2021; European Patent Office; 80298, Munich, Germany.

(Continued)

*Primary Examiner* — Tremesha S Willis
(74) *Attorney, Agent, or Firm* — Robert A. Blaha; Smith Tempel Blaha LLC

(57) ABSTRACT

A method of manufacturing a component carrier includes providing a laminated stack with at least one electrically conductive layer structure and/or at least one electrically insulating layer structure, at least partially covering a component with a transition layer having a thickness in a range from 0.5 nm to 1 μm, and assembling the component with the stack.

20 Claims, 3 Drawing Sheets

(56) References Cited

U.S. PATENT DOCUMENTS

| | | | |
|---|---|---|---|
| 2013/0175075 A1 | 7/2013 | Kivikero et al. | |
| 2013/0267066 A1* | 10/2013 | Park | H01L 24/96 |
| | | | 438/121 |
| 2014/0153204 A1 | 6/2014 | Kim et al. | |
| 2014/0182911 A1 | 7/2014 | Lee et al. | |
| 2015/0382478 A1 | 12/2015 | Shimada et al. | |
| 2016/0211221 A1* | 7/2016 | Kim | H01L 23/3121 |
| 2016/0381795 A1 | 12/2016 | Ikeda et al. | |
| 2017/0365566 A1 | 12/2017 | Lee et al. | |
| 2018/0164640 A1* | 6/2018 | Kim | G02F 1/133504 |
| 2018/0166396 A1 | 6/2018 | Lee et al. | |
| 2018/0213634 A1 | 7/2018 | Tuominen et al. | |
| 2019/0045636 A1* | 2/2019 | Schuster | H05K 3/0044 |

FOREIGN PATENT DOCUMENTS

| | | |
|---|---|---|
| DE | 2015009284 U1 | 1/2017 |
| DE | 202015009284 U1 | 1/2017 |
| WO | 2010/133767 A1 | 11/2010 |
| WO | 2019/124414 A1 | 6/2019 |

OTHER PUBLICATIONS

Office Action in Application No. 202010073861.8; pp. 1-8; dated Mar. 31, 2022; The China National Intellectual Property Administration; No. 6, Xitucheng Lu, Jimenqiao Haidian District, Beijing City, 100088, China.

English translation of cover pages of Office Action in Application No. 202010073861.8; pp. 1-3; dated Mar. 31, 2022; The China National Intellectual Property Administration; No. 6, Xitucheng Lu, Jimenqiao Haidian District, Beijing City, 100088, China.

* cited by examiner

COMPONENT CARRIER HAVING COMPONENT COVERED WITH ULTRA-THIN TRANSITION LAYER

TECHNICAL FIELD

The disclosure relates to a component carrier and to a method of manufacturing a component carrier.

TECHNOLOGICAL BACKGROUND

In the context of growing product functionalities of component carriers equipped with one or more electronic components and increasing miniaturization of such components as well as a rising number of components to be mounted on the component carriers such as printed circuit boards, increasingly more powerful array-like components or packages having several components are being employed, which have a plurality of contacts or connections, with ever smaller spacing between these contacts. Removal of heat generated by such components and the component carrier itself during operation becomes an increasing issue. At the same time, component carriers shall be mechanically robust and electrically reliable so as to be operable even under harsh conditions.

SUMMARY

Assembling a component on and/or in a component carrier with low effort while reliably ensuring the functionality of the component is still difficult.

There may be a need to assemble a component with a component carrier with high reliability.

According to an exemplary embodiment of the invention, a method of manufacturing a component carrier is provided, wherein the method comprises providing a laminated stack comprising at least one electrically conductive layer structure and/or at least one electrically insulating layer structure, at least partially covering a component with a transition layer having a thickness in a range from 0.5 nm to 1 µm, and assembling the component with the stack.

According to another exemplary embodiment of the invention, a component carrier is provided, wherein the component carrier comprises a laminated stack comprising at least one electrically conductive layer structure and/or at least one electrically insulating layer structure, and a component at least partially covered with a transition layer having a thickness in a range from 0.5 nm to 1 µm, wherein the component is assembled with the stack.

Overview of Embodiments

In the context of the present application, the term "component carrier" may particularly denote any support structure which is capable of accommodating one or more components thereon and/or therein for providing mechanical support and/or electrical connectivity. In other words, a component carrier may be configured as a mechanical and/or electronic carrier for components. In particular, a component carrier may be one of a printed circuit board, an organic interposer, and an IC (integrated circuit) substrate. A component carrier may also be a hybrid board combining different ones of the above-mentioned types of component carriers.

In the context of the present application, the term "stack" may particularly denote an arrangement of multiple planar layer structures which are mounted in parallel on top of one another.

In the context of the present application, the term "layer structure" may particularly denote a continuous layer, a patterned layer or a plurality of non-consecutive islands within a common plane.

In the context of the present application, the term "component" may particularly denote an inlay-type member. Such a component may be arranged in an interior of the stack. A component may in particular have an optical and/or electronic function. For instance, such a component may be a semiconductor die.

In the context of the present application, the term "laminating" may particularly denote connecting layer structures, such as layers, by the application of mechanical pressure and/or heat.

In the context of the present application, the term "transition layer" may particularly denote a planar or curved thin film or other kind of flat structure constituting a material interface between the covered component and its environment, in particular environmental stack material of the component carrier. Such a transition layer may be made of a material functioning as a bridge for promoting mechanical, electrical and/or thermal reliability and/or performance of the component carrier. The transition layer may be made of an electrically insulating material and/or of an electrically conductive material.

In the context of the present application, the term "thickness of the transition layer" may particularly denote a constant thickness of a transition layer with homogeneous or substantially homogeneous thickness, a maxi-mum thickness of a transition layer (for instance with an inhomogeneous thickness), or an average thickness of a transition layer (for instance with an inhomogeneous thickness).

According to an exemplary embodiment of the invention, a component carrier (such as a printed circuit board) is provided having a laminated (i.e., connected by pressure and/or heat) layer stack which includes a component. In many cases, such components are made of substantially different materials (for instance semiconductor materials such as silicon) than material of the stack (for instance copper, resin and optionally reinforcing glass particles). Hence, stack material(s) and component material(s) may show poor mutual adhesion, different behavior in the event of temperature changes as well as different mechanical and electrical properties. As a result, conventional component carriers with assembled component may suffer from undesired phenomena such as warpage, delamination and/or the formation of interior stress and cracks. Highly advantageously, an exemplary embodiment of the invention may sandwich a transition layer, covering at least a portion of the component, between said component and the laminated layer stack of the component carrier. As a result, the mechanical, electrical and/or thermal reliability of the component carrier may be adjusted and selectively improved by an appropriate selection of the material of the transition layer. Warpage, delamination and/or interior stress may thus be efficiently suppressed. Consequently, a highly reliable component carrier can be provided. By providing the transition layer with an ultra-small thickness in a range from 0.5 nm to 1 µm, the transition layer may be properly functionally effective but does not add a significant contribution to the overall thickness of the component carrier. Thus, the component carrier can be manufactured in a compact way. At the same time, such a very small thickness has the consequence that the provision of the transition layer does not fundamentally change the overall properties of the component carrier as a whole (for instance does not involve a further significant mismatch of the coefficient of thermal expansion to the usually heterogeneous material composition of the component carrier), but is selectively effective in particular locally at the critical interface between component and stack.

In the following, further exemplary embodiments of the method and the component carrier will be explained.

In an embodiment, the method comprises covering the component with the transition layer before the assembling. Such a procedure is simple and quick, since it may be sufficient to simply coat or immerse an exposed surface of the component into a liquid precursor of the transition layer.

In another embodiment, the method comprises covering the component with the transition layer after the assembling. For instance, coating of surface mounted components of component carriers may be carried out on panel level. This allows coating on an industrial scale and with high throughput.

In an embodiment, the method comprises carrying out a surface treatment, in particular a roughening, of at least one of at least part of a surface of the component and at least part of a surface of the transition layer. In particular, said surface treatment may be carried out before the assembling. In particular in addition to a coating procedure, a surface treatment of a component on which the transition layer is to be formed and/or of any exterior surface of the transition layer may be accomplished. This may further increase the reliability of the component carrier. Such a surface treatment may for instance be a plasma treatment, which may activate the respective surface. Additionally or alternatively, surface treatment may involve wet etching. By surface activation, adhesion may be further improved. In particular, surface treatment may be carried out to increase the roughness of the treated surface. Descriptively speaking, an increase of a connection surface area between component and stack may enhance attractive adhesion forces.

In an embodiment, the method comprises forming the transition layer by at least one of the group consisting of coating, wet process treatment, printing, dispensing and depositing. Other methods of forming the transition layer are possible as well.

In an embodiment, the method comprises forming the transition layer by vapor deposition, in particular by at least one of the group consisting of Physical Vapor Deposition (PVD) and Chemical Vapor Deposition (CVD). PVD denotes vacuum deposition methods which can be used to produce thin films and coatings. PVD is characterized by a process in which the material goes from a condensed phase to a vapor phase and then back to a thin film condensed phase. Examples for PVD processes are sputtering and evaporation. CVD denotes a vacuum deposition method which may be used to produce high quality, high-performance, solid materials. In CVD, the component to be covered with a transition layer may be exposed to one or more volatile precursors, which may react and/or decompose on the component surface to produce the desired deposit forming said transition layer. In particular for very small thicknesses, is also possible to create the transition layer by Atomic Layer Deposition (ALD).

In an embodiment, the transition layer is configured for promoting adhesion between the component and the stack. In other words, the transition layer may function as an adhesion promoter. This may efficiently suppress undesired delamination of the laminated layer stack, in particular in the presence of an embedded component.

Additionally or alternatively, the transition layer may be configured for sealing, in particular for hermetically sealing, the component. In other words, the transition layer may fully circumferentially surround the component and may decouple the component (for instance concerning moisture, concerning electric current and/or with respect to electromagnetic radiation) from an environment.

Further additionally or alternatively, the transition layer may be con-figured for buffering stress between the component and the stack. Descriptively speaking, this may be accomplished by making the transition layer of a material being softer (in particular having a smaller value of the Young modulus) than material of the component body and/or of the surrounding stack. Such a transition layer may serve as a mechanical buffer structure, i.e., as a mechanically relatively flexible or elastic structure. This may render said material highly appropriate for (in particular directly) surrounding an embedded component of the component carrier. Such a mechanical buffer structure may have a locally reduced value of the Young modulus and may therefore function as a mechanically damping or force balancing structure, for instance in the event of bending stress. As a result, such a low Young modulus material may also suppress warpage. In particular, the material of the transition layer may have a value of the Young modulus below 3 GPa, in particular below 1 GPa.

In an embodiment, the component comprises a redistribution layer (which may be arranged on a main surface of the component body) being at least partially covered by the transition layer. A redistribution layer or structure may be composed of one or more electrically insulating structures and one or more electrically conductive structures and may function as an electrical and mechanical interface between smaller dimensions relating to pads of the component (for instance a semiconductor chip) and larger dimensions of the component carrier stack, or even of a mounting base (such as a printed circuit board, PCB) on which the component carrier may be mounted. Such a redistribution layer may be coupled with electrically conductive terminals, pads or contacts of the component and may spread them spatially, for instance towards the exterior surface of the stack.

In an embodiment, only dielectric material of the redistribution layer is selectively covered by the transition layer. Such an embodiment is shown in FIG. 3. Alternatively, only electrically conductive material of the redistribution layer may be selectively covered by the transition layer. FIG. 4 describes such an embodiment. Still alternatively, an entire or substantially an entire exposed surface of the redistribution layer may be covered by the transition layer. A corresponding embodiment is shown in FIG. 5. Hence, the transition layer may be used to adjust the properties of the redistribution layer and its relationship with regard to surrounding material of the component carrier. In yet another embodiment, only a part of an exposed surface of the redistribution layer, which part is more prone to stress and/or delamination than another part of the exposed surface of the redistribution layer, is covered by the transition layer. Thus, just a part of the entire surface, i.e., a part that is particularly prone to stress/adhesion problems, may be selectively covered by transition layer.

In an embodiment, a component body (in particular a semiconductor component body) of the component is covered by the transition layer. Since a component body (for instance a piece of silicon) may have substantially different physical properties than organic stack material and copper, a transition layer interposed between component body and stack may function as a matching structure in between. For instance, the coefficient of thermal expansion (CTE) of the mentioned materials may be significantly different, which may result in thermal stress in the event of temperature changes. Such a CTE mismatch may be at least partially compensated by the transition layer in between, which may for instance have a CTE value in between a CTE value of the component body and another CTE value of stack.

In an embodiment, an entire surface of the component is covered by the transition layer. Alternatively, only part of the surface of the component may be covered with the transition layer.

In an embodiment, the transition layer comprises a material having hydrogen and/or hydroxyl groups. Such materials may be applied, for instance, by PVD or CVD or ALD. Such materials may function as adhesion promoter.

In an embodiment, the transition layer comprises a material having silane groups. In particular, bi-functional or multi-functional silane groups may efficiently promote adhesion between component(s) and stack material.

In an embodiment, the transition layer comprises a material having polyamideimide. Polyamideimide components may also have a positive impact on adhesion within the component carrier.

In an embodiment, the transition layer comprises a material having alumina. For instance, an alumina-coated or co-fired layer may be provided.

In an embodiment, the transition layer comprises a material having glass. More specifically, a glass-coated or co-fired layer may be used for forming the transition layer.

In an embodiment, the transition layer comprises a material having a ceramic. In particular, a toughened ceramic-coated or co-fired layer may be advantageously implemented. For instance, alumina, SiC whiskers and/or SiC plus graphene fillers may be used.

In an embodiment, the transition layer comprises a material having a resin. In particular, a surface-mounted component may be properly passivated by a coating of resin.

In an embodiment, the transition layer comprises a material having a metallic compound. Thus, not only electrically insulating materials can be used for the transition layer, it is also possible to use electrically conductive materials such as metallic compounds.

In a preferred embodiment, the transition layer comprises Bis(2-methoxyethyl)ether and aromatic polyamideimide. In particular, the transition layer may comprise 60 to 95 weight percent, in particular 80 to 90 weight percent, of Bis(2-methoxyethyl)ether. Correspondingly, the transition layer may comprise 5 to 40 weight percent, in particular 10 to 20 weight percent, of aromatic polyamideimide. Highly advantageously, the transition layer may additionally comprise N-Methyl-2-pyrrolidone, in particular as an additive. It has turned out to be advantageous that the transition layer is provided with less than 5 weight percent, in particular less than 1 weight percent, of N-Methyl-2-pyrrolidone. The mentioned mixture of Bis(2-methoxyethyl)ether, aromatic polyamideimide and N-Methyl-2-pyrrolidone shows excellent properties in terms of adhesion promotion.

In an embodiment, the component is embedded in the stack. In particular, said embedding may be partially (for instance the component may be inserted in a cavity so that the component still has surface access). It is also possible that the embedding is entirely, i.e., so that the entire component is surrounded by stack material. In particular, the component may be embedded completely in an interior, i.e., within the stack, or may be arranged in a cavity formed in the stack. Embedding the component in the stack may improve the compactness of the component carrier and may also keep the electric connection paths within the stack short. This may have, in turn, a positive impact on signal transmission quality and may allow to manufacture the component carrier in a space-saving way. Arranging one or more components in a cavity with access to an exterior of the stack may simplify heat removal during operation of the component carrier.

In another embodiment, the component is surface-mounted on the stack. Additionally or alternatively to the above-described interior embedding or cavity mounting of one or more components in the component carrier, it may also be possible to surface-mount at least one component. Surface-mounting may simplify heat removal from a corresponding component during operation, since such a component may be exposed to an environment of the component carrier which simplifies the heat transfer.

In an embodiment, the thickness of the transition layer is in a range from 1 nm to 100 nm, in particular in a range from 3 nm to 20 nm. Correspondingly, the method may comprise forming the transition layer with a thickness in a range from 1 nm to 100 nm, in particular in a range from 3 nm to 20 nm. Hence, the thickness of the transition layer may be extremely small so that it will not result in a significant increase of the overall space consumption of the component carrier while efficiently fulfilling its function at the transition between the layer-coated component and the surrounding of the component carrier.

In an embodiment, the component carrier comprises a stack of at least one electrically insulating layer structure and at least one electrically conductive layer structure. For example, the component carrier may be a laminate of the mentioned electrically insulating layer structure(s) and electrically conductive layer structure(s), in particular formed by applying mechanical pressure and/or thermal energy. The mentioned stack may provide a plate-shaped component carrier capable of providing a large mounting surface for further components and being nevertheless very thin and compact. The term "layer structure" may particularly denote a continuous layer, a patterned layer or a plurality of non-consecutive islands within a common plane.

In an embodiment, the component carrier is shaped as a plate. This contributes to the compact design, wherein the component carrier nevertheless provides a large basis for mounting components thereon. Furthermore, in particular a naked die as example for an embedded electronic component, can be conveniently embedded, thanks to its small thickness, into a thin plate such as a printed circuit board.

In an embodiment, the component carrier is configured as one of the group consisting of a printed circuit board, a substrate (in particular an IC substrate), and an interposer.

In the context of the present application, the term "printed circuit board" (PCB) may particularly denote a plate-shaped component carrier which is formed by laminating several electrically conductive layer structures with several electrically insulating layer structures, for instance by applying pressure and/or by the supply of thermal energy. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming through holes through the laminate, for instance by laser drilling or mechanical drilling, and by filling them with electrically conductive material (in particular copper), thereby forming vias as through hole connections. Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing fibers (such as glass fibers).

In the context of the present application, the term "substrate" may particularly denote a small component carrier. A substrate may be a, in relation to a PCB, comparably small component carrier onto which one or more components may be mounted and that may act as a connection medium between one or more chip(s) and a further PCB. For instance, a substrate may have substantially the same size as a component (in particular an electronic component) to be mounted thereon (for instance in case of a Chip Size Package (CSP)). More specifically, a substrate can be understood as a carrier for electrical connections or electrical networks as well as component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide electrical, thermal and/or mechanical connections of housed components or unhoused components (such as bare dies), particularly of IC chips, with a printed circuit board or intermediate printed circuit board. Thus, the term "substrate" also includes "IC substrates". A dielectric part of a substrate may be composed of resin with reinforcing particles (such as reinforcing spheres, in particular glass spheres).

The substrate or interposer may comprise or consist of at least a layer of glass, silicon (Si) or a photo-imageable or dry-etchable organic material like epoxy-based build-up material (such as epoxy-based build-up film) or polymer compounds like polyimide, polybenzoxazole, or benzocyclobutene-functionalized polymers.

In an embodiment, the at least one electrically insulating layer structure comprises at least one of the group consisting of resin (such as reinforced or non-reinforced resins, for instance epoxy resin or bismaleimide-triazine resin), cyanate ester resins, polyphenylene derivate, glass (in particular glass fibers, multi-layer glass, glass-like materials), prepreg material (such as FR-4 or FR-5), polyimide, polyamide, liquid crystal polymer (LCP), epoxy-based build-up film, polytetrafluoroethylene (PTFE, Teflon®), a ceramic, and a metal oxide. Teflon® is a registered mark of The Chemours Company FC LLC of Wilmington, Del., U.S.A. Reinforcing structures such as webs, fibers or spheres, for example made of glass (multilayer glass) may be used as well. Although prepreg particularly FR4 are usually preferred for rigid PCBs, other materials in particular epoxy-based build-up film or photo-imageable dielectric material may be used as well. For high frequency applications, high-frequency materials such as polytetrafluoroethylene, liquid crystal polymer and/or cyanate ester resins, low temperature cofired ceramics (LTCC) or other low, very low or ultra-low DK materials may be implemented in the component carrier as electrically insulating layer structure.

In an embodiment, the at least one electrically conductive layer structures comprises at least one of the group consisting of copper, aluminum, nickel, silver, gold, palladium, and tungsten. Although copper is usually preferred, other materials or coated versions thereof are possible as well, in particular coated with supra-conductive material such as graphene.

At least one component, which can be optionally surface mounted on and/or embedded in the stack, can be selected from a group consisting of an electrically non-conductive inlay, an electrically conductive inlay (such as a metal inlay, preferably comprising copper or aluminum), a heat transfer unit (for example a heat pipe), a light guiding element (for example an optical waveguide or a light conductor connection), an optical element (for instance a lens), an electronic component, or combinations thereof. For example, the component can be an active electronic component, a passive electronic component, an electronic chip, a storage device (for instance a DRAM or another data memory), a filter, an integrated circuit, a signal processing component, a power management component, an optoelectronic interface element, a light emitting diode, a photocoupler, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, and an energy harvesting unit. However, other components may be embedded in the component carrier. For example, a magnetic element can be used as a component. Such a magnetic element may be a permanent magnetic element (such as a ferromagnetic element, an antiferromagnetic element, a multiferroic element or a ferrimagnetic element, for instance a ferrite core) or may be a paramagnetic element. However, the component may also be a substrate, an interposer or a further component carrier, for example in a board-in-board configuration. The component may be surface mounted on the component carrier and/or may be embedded in an interior thereof. Moreover, also other components, may be used as component.

In an embodiment, the component carrier is a laminate-type component carrier. In such an embodiment, the component carrier is a compound of multiple layer structures which are stacked and connected together by applying a pressing force and/or heat.

After processing interior layer structures of the component carrier, it is possible to cover (in particular by lamination) one or both opposing main surfaces of the processed layer structures symmetrically or asymmetrically with one or more further electrically insulating layer structures and/or electrically conductive layer structures. In other words, a build-up may be continued until a desired number of layers is obtained After having completed formation of a stack of electrically insulating layer structures and electrically conductive layer structures, it is possible to proceed with a surface treatment of the obtained layers structures or component carrier.

In particular, an electrically insulating solder resist may be applied to one or both opposing main surfaces of the layer stack or component carrier in terms of surface treatment. For instance, it is possible to form such as solder resist on an entire main surface and to subsequently pattern the layer of solder resist so as to expose one or more electrically conductive surface portions which shall be used for electrically coupling the component carrier to an electronic periphery. The surface portions of the component carrier remaining covered with solder resist may be efficiently protected against oxidation or corrosion, in particular surface portions containing copper.

It is also possible to apply a surface finish selectively to exposed electrically conductive surface portions of the component carrier in terms of surface treatment. Such a surface finish may be an electrically conductive cover material on exposed electrically conductive layer structures (such as pads, conductive tracks, etc., in particular comprising or consisting of copper) on a surface of a component carrier. If such exposed electrically conductive layer structures are left unprotected, then the exposed electrically conductive component carrier material (in particular copper) might oxidize, making the component carrier less reliable. A surface finish may then be formed for instance as an interface between a surface mounted component and the component carrier. The surface finish has the function to protect the exposed electrically conductive layer structures (in particular copper circuitry) and enable a joining process with one or more components, for instance by soldering. Examples for appropriate materials for a surface finish are Organic Solderability Preservative (OSP), Electroless Nickel Immersion Gold (ENIG), gold (in particular Hard Gold), chemical tin, nickel-gold, nickel-palladium, Electroless Nickel Immersion Palladium Immersion Gold (ENIPIG), etc.

The aspects defined above and further aspects of the invention are apparent from the examples of embodiment to be described hereinafter and are explained with reference to these examples of embodiment.

DETAILED DESCRIPTION OF THE ILLUSTRATED EMBODIMENTS

Figure 1:
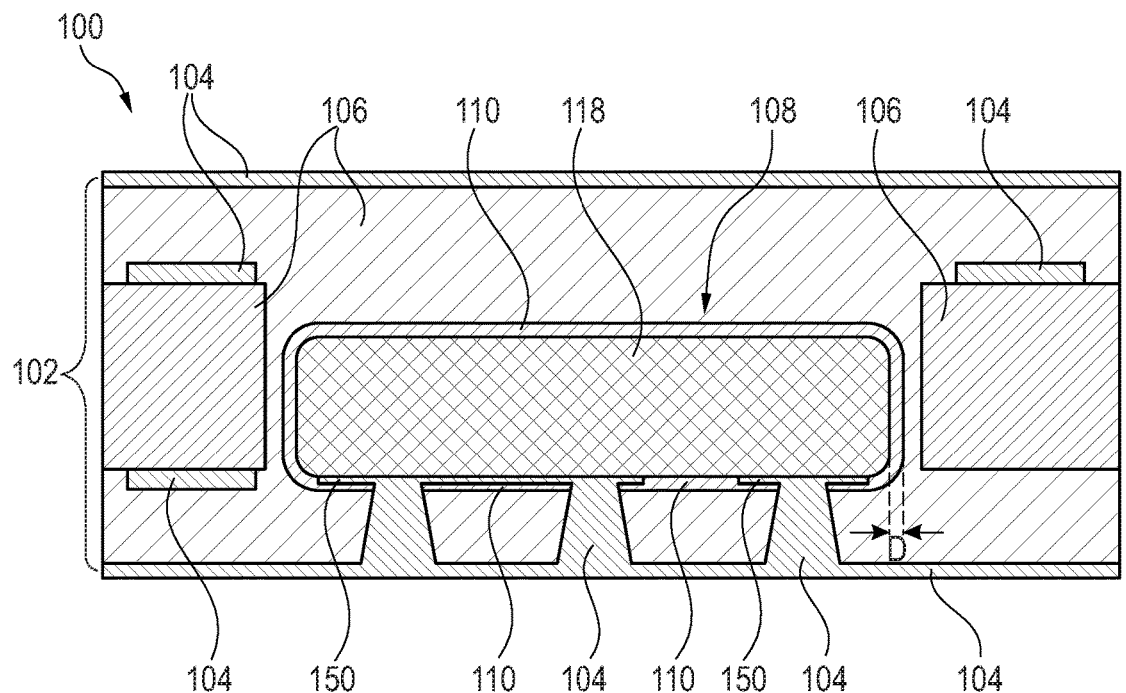
FIG. 1 illustrates a cross-sectional view of a component carrier with an embedded component covered with a transition layer according to an exemplary embodiment of the invention.

The illustrations in the drawings are schematically presented. In different drawings, similar or identical elements are provided with the same reference signs.

Before, referring to the drawings, exemplary embodiments will be described in further detail, some basic considerations will be summarized based on which exemplary embodiments of the invention have been developed.

According to an exemplary embodiment of the invention, a component carrier is provided which embeds, packages and/or surface mounts at least one component which may be made subject to coating and/or surface treatment. More specifically, it may be possible to create a transition layer on the component before or after placement of the component on or in the stack of a component carrier, which may be configured as package carrier printed circuit board (PCB).

In particular, such additional transition layer may serve for one more of the following purposes: In one embodiment, the transition layer may be configured to reduce or solve a risk of separation of the component from the encapsulating layer stack. Additionally or alternatively, it may be possible to configure the transition layer to at least reduce a localized stress concentration by eliminating micro fractures and micro separation from specific areas of one or more (for instance active and/or passive) components, sensors, interposers, etc. Moreover, it may also be possible to configure the transition layer for improving adhesion between resin of the layer stack and a surface of the component. Apart from this, it may be possible to configure the transition layer to increase the reliability of the component carrier by providing a hermetic sealing of the component. Additionally or alternatively, it may be possible to configure the material of the transition layer for increasing an affinity between the component and the laminate-type encapsulant. This may be advantageous in particular for embedding applications. Beyond this, exemplary embodiments of the invention may improve the freedom to embed different sizes and shapes of components. Furthermore, it may be possible to improve a stress distribution by inducing improvement upon high thermal, mechanical and electrical properties. In particular, it may be possible to achieve a reliable behaviour even in a harsh environment, avoiding stress concentration and crack propagation and a path for electrochemical migration.

Exemplary embodiments of the invention provide a manufacturing architecture of introducing an additional transition layer on a component surface prior and/or after the placement of the component on or in a component carrier stack (in particular in the context of an embedded PCB carrier system).

Furthermore, exemplary embodiments of the invention may enable the design of (in particular embedded) packages with very high adhesion properties to encapsulated components. Advantageously, this may result in a pronounced reliability improvement, in particular in terms of thermal reliability, chemical reliability, mechanical reliability and/or electrical reliability.

According to an exemplary embodiment of the invention, a surface optimized component may be processed for encapsulation in dielectric material. A modified component surface may provide available functional groups for further improved adhesion strength with respect to encapsulating material of the laminated layer stack. Advantageously, a surface modification can be induced by a treatment to promote the extent of functional groups. This may encompass component surface in situ functionalization, but also by coating the component with coating material that has good bonding stress to component and to encapsulant. The above-mentioned transition layer may also be configured to have properties that allow further functionalization for optimized bonding. For example, a coating material which may be used for forming said transition layer can be polymeric, ceramic, metallic and/or any combination of these to fulfil different application-specific requirements. In embodiments, a modified component surface may be configured to provide increased functional groups, increased wettability, increased surface energy, etc. The transition layer may also provide an extended thickness for elastic or plastic absorption of periodic or environmental stress variation in order to decrease the stress concentration on component edges, or other areas with peak stress. Furthermore, the transition layer may function as a localized shock absorber.

In different embodiments, partial or complete component surface modification and/or coating may be possible. As a result, a component carrier with improved reliability may be obtained, in particular in the context of embedded packages.

In an embodiment, a more reliable adhesion performance of an embedded part of a component carrier may be achieved. Indeed, surface optimization may further improve the bonding stress and may have the opportunity to locally redistribute the stress by increasing the bonding in treated areas. In embodiments, adhesion properties may be better, and the thermal, mechanical and electrical reliability may be improved. Engineering and specific design to distress certain areas of the component may be implemented as well. In particular, it may be possible to locally or globally improve a thermo-mechanical behaviour, and a delamination risk may be strongly suppressed.

It is also possible to apply a functionalization to the transition layer, as well as coating technologies and materials for further improving performance of the component carrier.

Exemplary embodiments of the invention can be implemented in terms of manufacturing technologies such as center core embedding, surface mounting, etc. Embodiments of the invention may enable the manufacture of highly reliable embedded packages with reasonable effort. Furthermore, said manufacturing architecture is compatible with the embedding of components of any desired size and/or shape. Further advantages are a high achievable yield and a high freedom of selecting appropriate materials. The produced components to be encapsulated (in particular totally or partially, with embedding or underfill) may show high mechanical, thermal and electrical reliability.

FIG. 1 illustrates a cross-sectional view of a component carrier 100 with an embedded component 108 covered with a transition layer 110 according to an exemplary embodiment of the invention.

Stack 102 of component carrier 100 may be a plate-shaped laminate-type layer stack composed of a plurality of electrically conductive layer structures 104 and a plurality of electrically insulating layer structures 106. For example, the electrically conductive layer structures 104 may comprise patterned copper foils and vertical through connections, for example copper filled laser vias. The electrically insulating layer structures 106 may comprise a resin (such as epoxy resin) and optionally reinforcing particles therein (for instance glass fibers or glass spheres). For instance, the electrically insulating layer structures 106 may be made of FR4 or ABF. In the shown embodiment, the thick central electrically insulating layer structure 106 may be a fully cured core.

In order to obtain the component carrier 100 shown in FIG. 1, component 108 (for instance a semiconductor chip) is placed in a cavity (not shown) formed in the layer stack 102. The above-mentioned cavity may be defined by a through-hole in the thick central electrically insulating layer structure 106 of the stack 102 which may be closed on a bottom side by attaching a temporary carrier (not shown) to a lower main surface of the core. The temporary carrier may for instance be a sticky tape. The component 108 with (here downwardly protruding) pads 150 may be attached with direct physical contact on the temporary carrier in the cavity. The function of the temporary carrier is to provide stability as long as the component 108 is not yet fixated (for instance glued) in place within the cavity.

The component carrier 100 shown in FIG. 1 can then be obtained by laminating one or more further electrically insulating layer structures 106 and one or more further electrically conductive layer structures 104 to the upper main surface of the central electrically insulating layer structure 106 accommodating component 108. For instance, a prepreg layer (as further electrically insulating layer structure 106) and one or more copper foils (as further electrically conductive layer structure 104) may be laminated on top. During the lamination process, uncured material of the further electrically insulating layer structure 106 may become flowable or melt and may flow in gaps between stack 102, temporary carrier and component 108. Upon curing (for instance cross-linking, polymerizing, etc.) of the material of the further electrically insulating layer structure 106, filling medium in said gaps may become solid.

As an alternative to the described lamination, it is also possible to glue component 108 in place in the cavity formed in stack 102 by filling liquid adhesive material in the gaps in between. Upon curing said adhesive material, the component 108 is again glued in place in the cavity.

After having glued the component 108 in place within the cavity and thus having provided an integral connection with stack 102, the temporary carrier may be removed. When the temporary carrier is a sticky tape, it may be simply peeled off from the lower main surface of the obtained structure. One or more further electrically conductive layer structures 104 and electrically insulating layer structures 106 may be connected to and/or formed at the lower surface of the obtained structure to thereby obtain stack 102 as shown in FIG. 1.

By carrying out the described manufacturing process, the illustrated component carrier 100 having laminated stack 102 of electrically conductive layer structures 104 and electrically insulating layer structures 106 with embedded component 108 is obtained.

Moreover, the embedded component 108 of the component carrier 100 according to FIG. 1 is fully circumferentially covered with a surrounding transition layer 110. A material of the transition layer 110 may be configured for promoting adhesion between the component 108 and the surrounding material of the laminated layer stack 102 (for instance by providing the transition layer 110 with hydroxyl groups and/or silane groups). This may reduce the tendency of delamination of the constituents of component carrier 100. Additionally or alternatively, the material of the transition layer 110 may be configured for hermetically sealing the component 108 with respect to surrounding material of laminated layer stack 102 (for instance by providing the transition layer 110 of a sealing varnish or a plastic layer). For instance, component 108 may thereby be protected against any undesired migration or diffusion of material, for instance moisture. It is also possible that the material of the transition layer 110 is configured for buffering stress between the component 108 and the stack 102 (for instance by providing the transition layer 110 from a material comprising a soft epoxy resin). When configured as a mechanical stress buffer, the transition layer 110 may for instance be made of a soft material, for instance having a value of the Young modulus of not more than 3 GPa. When embodied as a stress buffer, the transition layer 110 may also be configured for at least partially compensating a CTE (coefficient of thermal expansion) mismatch between material of the component 108 (for instance a semiconductor material such as silicon, when component 108 is embodied as semiconductor chip) and the materials of the stack 102 (such as organic resin, glass and copper).

For instance and depending on its desired technical function as part of the component carrier 100, the transition layer 110 may comprise hydrogen and/or hydroxyl groups, silane groups, polyamideimide, alumina, glass, a ceramic, a resin and/or a metallic compound in order to obtain one or more of the above described functionalizations. It may be particularly preferred in terms of an extremely efficient adhesion promotion, that the transition layer 110 comprises 80 to 90 weight percent of Bis2-methoxyethylether, 10 to 20 weight percent of aromatic polyamideimide, and less than 1 weight percent of N-Methyl-2-pyrrolidone (wherein a person skilled in the art will understand that the sum of all constituents of the transition layer 110 is always 100 weight percent).

In the embodiment of FIG. 1, an exposed surface of a semiconductor component body 118 of the embedded component 108 is covered by the transition layer 110, as well as part of its pads 150. Thus, almost an entire surface of the component 108 is covered by the transition layer 110 according to FIG. 1. More precisely, the transition layer 110 covers the entire surface of the component 108 except for the locations of the through vias contacting the component pads 150. More generally, an entire surface of the component 108 except for three sub-portions relating to component pads 150 being directly electrically connected to part of the electrically conductive layer structures 104 is covered by the transition layer 110.

A thickness D of the transition layer 110 may be substantially homogeneous and may be preferably in a range from 3 nm to 20 nm, for instance about 10 nm. Such an ultra-thin transition layer 110 may be properly functionally effective in suppressing delamination and warpage, but does not add a significant contribution to the overall thickness of the consequently highly compact component carrier 100. Moreover, the presence of the transition layer 110 keeps the overall properties of the component carrier 100 substantially unchanged and fulfils its task of promoting adhesion, suppressing delamination and reducing warpage specifically in a limited region around the most critical interface between the embedded component 108 (which may be substantially made of silicon) and the laminated layer stack 102 (which may be composed of epoxy resin, glass fibers and copper structures).

What concerns the manufacturing method used for obtaining component carrier 100 shown in FIG. 1, the component 108 may be covered with the transition layer 110 before its embedding in stack 102, i.e., before placing component 108 in the above-mentioned cavity. Thus, transition layer 110 functioning as additional adhesion promoter layer may be advantageously applied prior to the embedding process. Preferably, the transition layer 110 is created by vapor deposition, such as Physical Vapor Deposition (PVD) or Chemical Vapor Deposition (CVD), or by Atomic Layer Deposition (ALD). In order to further improve the adhesion properties, the surface of the component body 118 (before covering it with the transition layer 110) and/or the surface of the transition layer 110 (after being formed to cover the component body 118) may be made subject of a surface treatment, such as roughening by plasma etching or by wet etching. In such a scenario, the material properties and the surface properties of the transition layer 110 may both contribute to an excellent adhesion with component carrier 100.

Although one specific embedding method has been described referring to FIG. 1, exemplary embodiments of the invention may be manufactured with very different component packaging methods and/or may be used for very different embedding applications. The embodiment of FIG. 1 only demonstrates an example of a center core embedding process.

Figure 2:
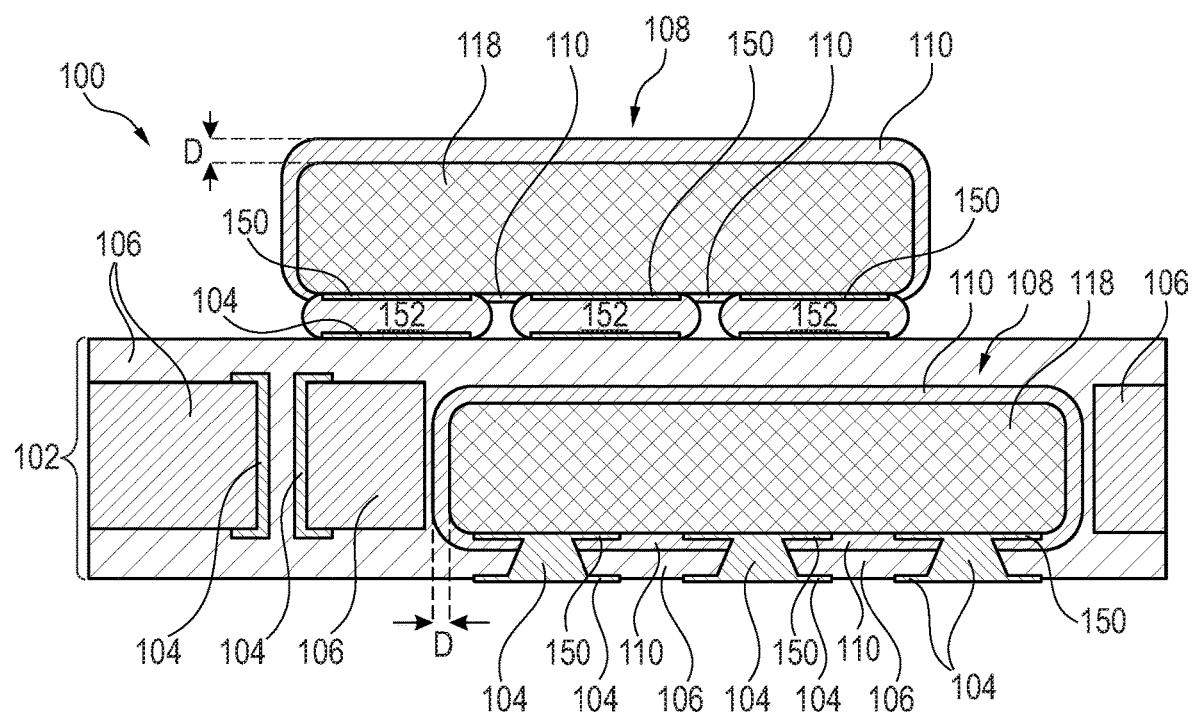
FIG. 2 illustrates a cross-sectional view of a component carrier with a surface-mounted component covered with a transition layer according to another exemplary embodiment of the invention, wherein this embodiment also comprises a further component being covered and embedded in a similar way as shown in FIG. 1.

FIG. 2 illustrates a cross-sectional view of a component carrier 100 with an embedded first component 108 covered with a transition layer 110 and with a surface-mounted second component 108 covered with a further transition layer 110 according to another exemplary embodiment of the invention. Thus, in the embodiment according to FIG. 2, first component 108 is embedded within stack 102, whereas second component 108 is surface mounted on an exterior main surface of stack 102.

The first component 108 may be embedded in stack 102 in a way as described above referring to FIG. 1.

The second component 108 is surface-mounted on the stack 102 by establishing a solder connection using solder structures 152 between stack 102 and second component 108. As shown, also the second component 108 is provided with a transition layer 110 covering substantially the entire exterior exposed surface of the second component 108. For instance, formation of the transition layer 110 of the second component 108 may be accomplished after surface mounting second component 108 on top of stack 102. The function of the transition layer 110 of the second component 108 may be the same or another one as that of the transition layer 110 of the first component 108.

Hence, the embodiment of FIG. 2 illustrates that exemplary embodiments of the invention may be also implemented in terms of surface mounting or connection applications where the component surface is activated or coated, for instance with resin, ceramic or metallic compounds.

In the following, referring to FIG. 3 to FIG. 6, various embodiments of components 108 covered with different kinds of transition layers 110 will be described. Any of these surface covered components 108 may be embedded in a laminated layer stack 102 (for instance as shown in FIG. 1) or may be surface mounted on a laminate in layer stack 102 (for instance as shown in FIG. 2). Each of FIG. 3 to FIG. 6 shows a corresponding component 108 before and after being covered with the respective transition layer 110, wherein a respective arrow 154 schematically illustrates the surface covering process.

Figure 3:
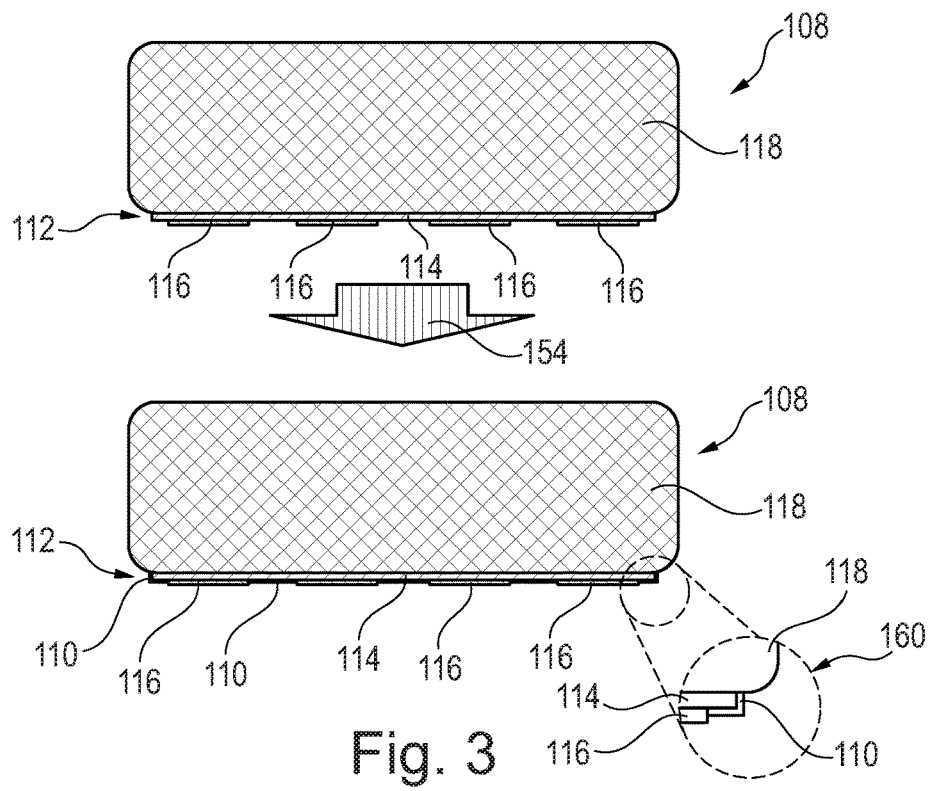
FIG. 3 illustrates a cross-sectional view of a component with a transition layer on dielectric material of a redistribution layer and/or on a component body according to an exemplary embodiment of the invention.

FIG. 3 illustrates a cross-sectional view of a component 108 with a transition layer 110 on dielectric material 114 of a redistribution layer 112 of the component 108 (and optionally also on a component body 118 of the component 108) according to an exemplary embodiment of the invention.

Hence, component 108 illustrated in FIG. 3 is provided with a redistribution layer 112 arranged at a bottom surface of the component 108. Said redistribution layer 112 may serve as an electric interface providing a transition between small dimensions of pads (compare reference sign 150 in FIG. 1 and FIG. 2, not shown but also present in FIG. 3) of the semiconductor chip world and larger pads or traces of the world of the (in particular PCB-type) component carrier 100.

Although not entirely shown in FIG. 3 including detail 160 (and correspondingly not shown in FIG. 4 including detail 162 and FIG. 5 including detail 164 and FIG. 6), the redistribution layer 112 is composed of electrically conductive sections as well as dielectric sections. The dielectric sections in the redistribution layer 112 corresponds to dielectric material 114. The electrically conductive sections include the electrically conductive material 116 shown in FIG. 3 (and correspondingly in FIG. 4, FIG. 5 and FIG. 6). However, the electrically conductive sections also include electrically conductive portions within the layer denoted with reference sign 114 spacing the illustrated electrically conductive material 116 from the component body 118. The latter mentioned electrically conductive portions at the level of the dielectric material 114 are not visible in the view of FIG. 3 (and correspondingly not visible in the views of FIG. 4 to FIG. 6). Thus, the height region corresponding to dielectric material 114 is not fully dielectric, but it also includes (not illustrated) electrically conductive portions which support electrical conductivity between electrically conductive material 116 and component body 118, more specifically pads 150 thereof. Said electrically conductive portions within dielectric material 114 are however not exposed and therefore not covered with a transition layer 110.

In the embodiment of FIG. 3, the redistribution layer 112 is only partially covered by the transition layer 110. Reference is made specifically to a detail 160 of FIG. 3. More specifically, only dielectric material 114 (for example polyimide) of the redistribution layer 112 is selectively covered by the transition layer 110 for promoting adhesion of component 108 in a component carrier 100. For this purpose, the dielectric portion of the redistribution layer 112 may be selectively coated or activated. It is also possible that the illustrated exposed surface of the component body 118 is also coated with a transition layer 110 and/or is activated (for instance surface activated, for example by a plasma treatment for increasing surface roughness).

Figure 4:
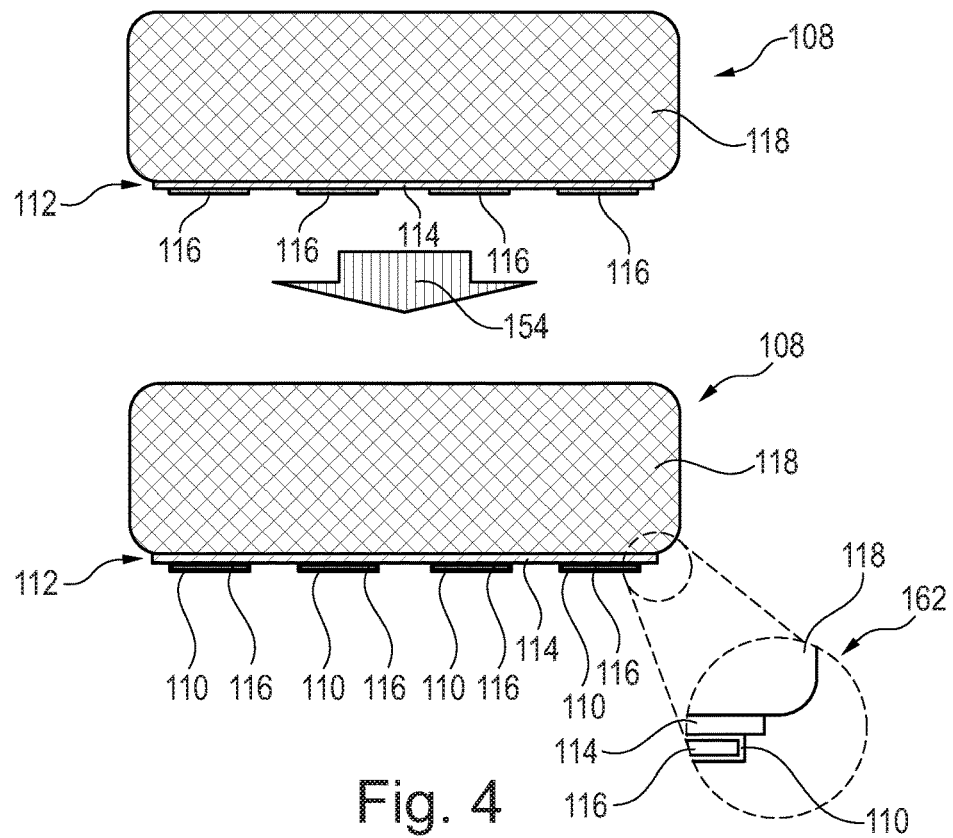
FIG. 4 illustrates a cross-sectional view of a component with a transition layer on connection pads according to another exemplary embodiment of the invention.

FIG. 4 illustrates a cross-sectional view of a component 108 with a transition layer 110 on connection pads of redistribution layer 112 according to another exemplary embodiment of the invention.

More specifically, only electrically conductive material 116 (for instance copper) of the redistribution layer 112 is selectively covered by the transition layer 110. Reference is made specifically to a detail 162 of FIG. 4. Hence, component connection terminals are selectively coated or activated according to FIG. 4. For instance, the component terminals may be coated or activated by a chemical or by a CVD and/or PVD process to increase adhesion. In particular, ALD (Atomic Layer Deposition) may be also used for this purpose.

However, the part of the transition layer 110 which is not located on an exposed surface of electrically conductive material 116 according to detail 162 can optionally be omitted (even though displayed in the detail 162 of FIG. 4). Said optional part of the transition layer 110 may for instance be formed on the (not illustrated) electrically conductive portions of the redistribution layer 112 within the layer relating to dielectric material 114.

In particular, the transition layer 110 coating only the connection terminals can be applied on at least one, several or all sides of the connection terminal surface. In production practice, the option of covering any side of the electrically conductive material 116 except the innermost side is particularly simple.

Figure 5:
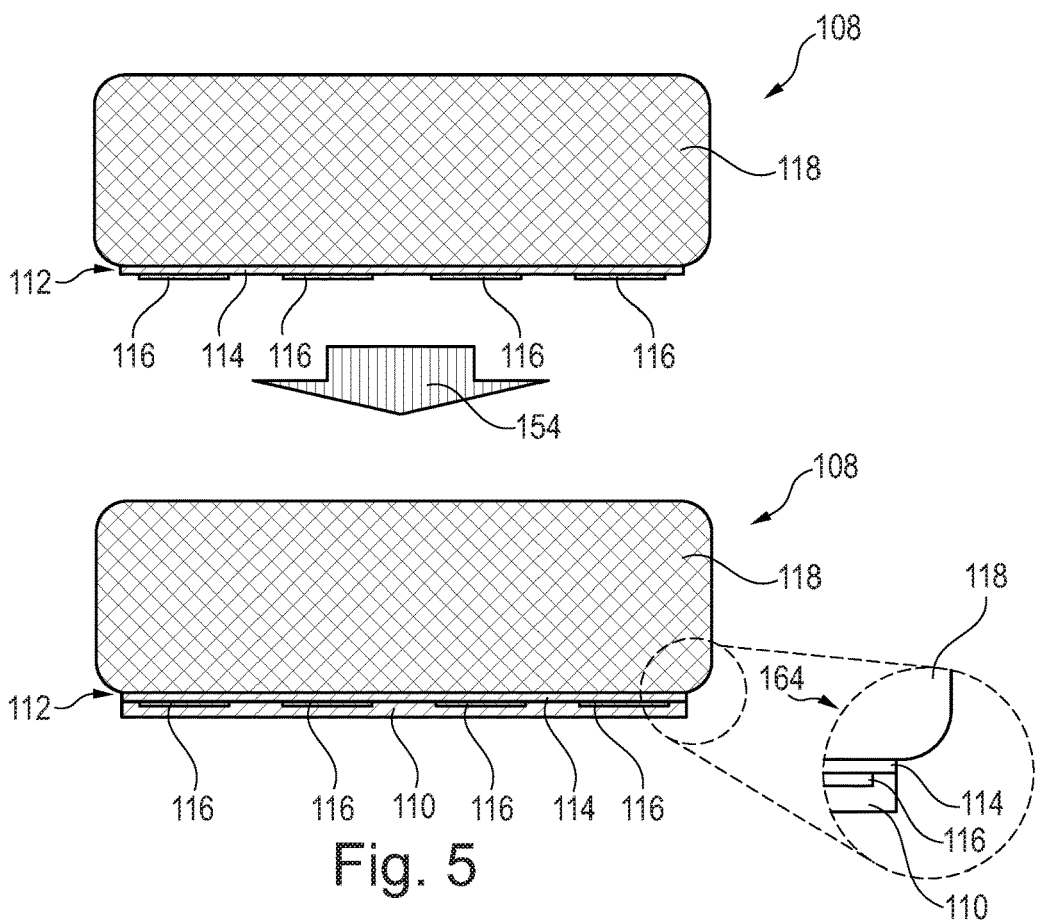
FIG. 5 illustrates a cross-sectional view of a component with a transition layer substantially on a complete exposed surface of a redistribution layer according to still another exemplary embodiment of the invention.
Figure 5:
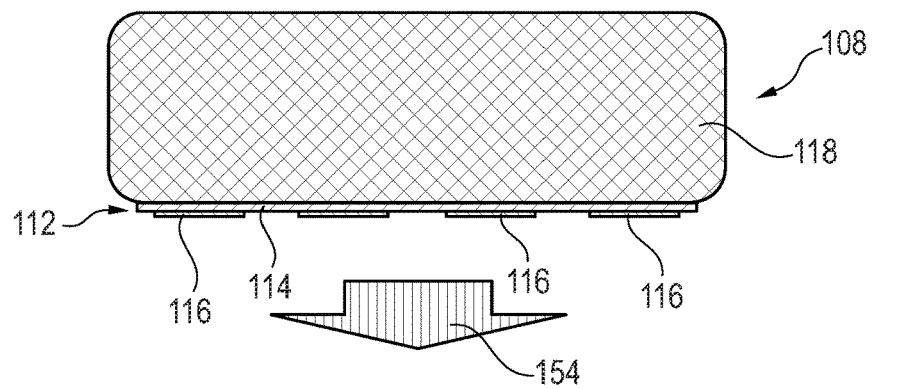

FIG. 5 illustrates a cross-sectional view of a component 108 with a transition layer 110 on a complete redistribution layer 112 according to still another exemplary embodiment of the invention.

Thus, substantially an entire exposed surface of the redistribution layer 112 is covered by the transition layer 110 according to FIG. 5. Reference is made specifically to a detail 164 of FIG. 5. FIG. 5 illustrates component connection terminals being embedded in the redistribution layer 112, or in other material. A full coating or coverage of redistribution layer 112 is thereby established over all the terminals, for instance to prevent oxidation and/or to increase adhesion.

Figure 6:
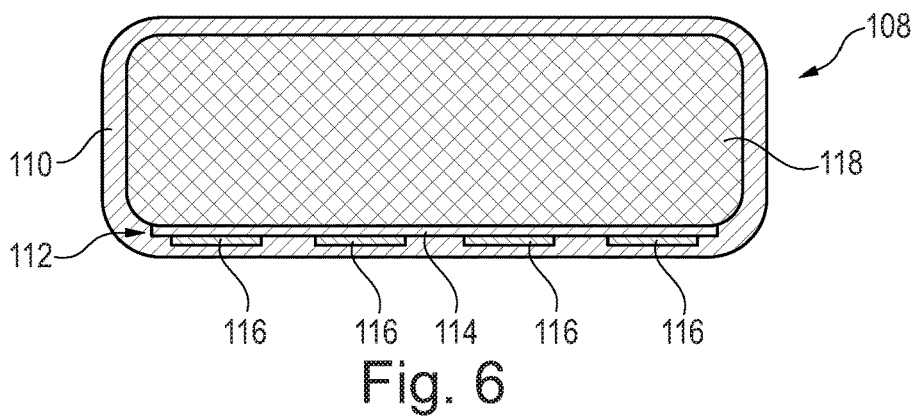
FIG. 6 illustrates a cross-sectional view of a component being completely surrounded by a hermetically sealing transition layer according to yet another exemplary embodiment of the invention.

FIG. 6 illustrates a cross-sectional view of a component 108 being completely surrounded by a hermetically sealing transition layer 110 according to yet another exemplary embodiment of the invention.

The embodiment of FIG. 6 therefore relates to a component 108 being completely coated by resin. When coating the whole component 108 with resin or primer resin or another polymer system, it may be possible to significantly increase the adhesion and thereby the reliability of the component carrier 100 with said component 108.

It should be noted that the term "comprising" does not exclude other elements or steps and the article "a" or "an" does not exclude a plurality. Also, elements described in association with different embodiments may be combined.

Implementation of the invention is not limited to the preferred embodiments shown in the figures and described above. Instead, a multiplicity of variants is possible which variants use the solutions shown and the principle according to the invention even in the case of fundamentally different embodiments.

The invention claimed is:

1. A method of manufacturing a component carrier, comprising:
    providing a laminated stack having at least one electrically conductive layer structure and/or at least one electrically insulating layer structure;
    at least partially covering a component with a transition layer having a thickness in a range from 1.0 nm to 100 nm;
    assembling the component with the stack; and
    at least partially covering a redistribution layer by the transition layer;
    wherein the component carrier is a printed circuit board or IC substrate, and
    wherein surfaces of the component except for at least one portion of at least one component pad being directly electrically connected to the at least one electrically conductive layer structure, are in direct contact with the transition layer.

2. The method according to claim 1, wherein the method comprises covering the component with the transition layer before the assembling or after the assembling.

3. The method according to claim 1, wherein the method comprises forming the transition layer with a thickness in a range from 3 nm to 20 nm.

4. The method according to claim 1, further comprising:
    carrying out a surface treatment of at least one of at least part of a surface of the component and at least part of a surface of the transition layer.

5. The method according to claim 1, wherein the method comprises forming the transition layer by at least one of the group consisting of coating, wet process treatment, printing, dispensing and depositing.

6. The method according to claim 1, wherein the method comprises forming the transition layer by vapor deposition, in particular by at least one of the group consisting of Physical Vapor Deposition and Chemical Vapor Deposition.

7. A component carrier, comprising:
    a laminated stack having at least one electrically conductive layer structure and/or at least one electrically insulating layer structure; and
    a component at least partially covered with a transition layer having a thickness in a range from 1.0 nm to 100 nm; and
    a redistribution layer being at least partially covered by the transition layer;
    wherein the component is assembled with the stack,
    wherein the component carrier is a printed circuit board, and
    wherein surfaces of the component except for at least one portion of at least one component pad being directly electrically connected to the at least one electrically conductive layer structure are in direct contact with the transition layer.

8. The component carrier according to claim 7, wherein the transition layer is configured for promoting adhesion between the component and the stack.

9. The component carrier according to claim 7, wherein the transition layer is configured for sealing the component.

10. The component carrier according to claim 7, wherein the transition layer is configured for buffering stress between the component and the stack.

11. The component carrier according to claim 7, comprising at least one of the following features:
  only a dielectric material of the redistribution layer is selectively covered by the transition layer;
  only an electrically conductive material of the redistribution layer is selectively covered by the transition layer;
  an entire exposed surface of the redistribution layer, except for at least one surface portion of electrically conductive material of the redistribution layer contacting at least one component pad, is covered by the transition layer;
  only a part of an exposed surface of the redistribution layer, which part is more prone to stress and/or delamination than another part of the exposed surface of the redistribution layer, is covered by the transition layer.

12. The component carrier according to claim 7, comprising at least one of the following features:
  a component body of the component is covered by the transition layer;
  an entire surface of the component is covered by the transition layer;
  the transition layer comprises a material having hydrogen and/or hydroxyl groups;
  the transition layer comprises a material having silane groups;
  the transition layer comprises a material having polyamideimide;
  the transition layer comprises a material having alumina;
  the transition layer comprises a material having glass;
  the transition layer comprises a material having a ceramic;
  the transition layer comprises a material having a resin;
  the transition layer comprises a material having a metallic compound.

13. The component carrier according to claim 7, wherein the transition layer comprises Bis(2-methoxyethyl)ether and aromatic polyamideimide.

14. The component carrier according to claim 13, comprising at least one of the following features:
  the transition layer comprises 60 to 95 weight percent of Bis(2-methoxyethyl)ether;
  the transition layer comprises 5 to 40 weight percent of aromatic polyamideimide;
  the transition layer comprises N-Methyl-2-pyrrolidone.

15. The component carrier according to claim 14, wherein the transition layer comprises less than 5 weight percent of N-Methyl-2-pyrrolidone.

16. The component carrier according to claim 7, wherein the component is embedded in the stack.

17. The component carrier according to claim 7, wherein the component is surface-mounted on the stack.

18. The component carrier according to claim 7, wherein the thickness of the transition layer is in a range from 3 nm to 20 nm.

19. The component carrier according to claim 7, comprising at least one of the following features:
  the component is selected from a group consisting of an electronic component, an electrically non-conductive and/or electrically conductive inlay, a heat transfer unit, a light guiding element, an optical element, a bridge, an energy harvesting unit, an active electronic component, a passive electronic component, an electronic chip, a storage device, a filter, an integrated circuit, a signal processing component, a power management component, an optoelectronic interface element, a voltage converter, a cryptographic component, a transmitter and/or receiver, an electromechanical transducer, an actuator, a microelectromechanical system, a microprocessor, a capacitor, a resistor, an inductance, an accumulator, a switch, a camera, an antenna, a magnetic element, a further component carrier, and a logic chip;
  the at least one electrically conductive layer structure comprises at least one of the group consisting of copper, aluminum, nickel, silver, gold, palladium, and tungsten;
  the at least one electrically insulating layer structure comprises at least one of the group consisting of reinforced or non-reinforced resin, epoxy resin or Bismaleimide-Triazine resin, FR-4, FR-5, cyanate ester, polyphenylene derivate, glass, prepreg material, polyimide, polyamide, liquid crystal polymer, epoxy-based build-up material, polytetrafluoroethylene, a ceramic, and a metal oxide;
  the component carrier is shaped as a plate;
  the component carrier is configured as one of the group consisting of a printed circuit board, and a substrate;
  the component carrier is configured as a laminate-type component carrier.

20. A method of manufacturing a component carrier, comprising:
  providing a laminated stack having at least one electrically conductive layer structure and/or at least one electrically insulating layer structure;
  at least partially covering a component with a transition layer having a thickness in a range from 1.0 nm to 100 nm;
  assembling the component with the stack; and
  at least partially covering a redistribution layer by the transition layer; and
  covering the component with the transition layer before the assembling;
  wherein the component carrier is a printed circuit board or IC substrate,
  wherein surfaces of the component, except for at least one portion of at least one component pad being directly electrically connected to the at least one electrically conductive layer structure, are covered by the transition layer.

* * * * *